United States Patent
Tanji et al.

(10) Patent No.: US 10,794,969 B2
(45) Date of Patent: Oct. 6, 2020

(54) RF CIRCUIT, MRI APPARATUS, AND METHOD OF MONITORING RF PULSE POWER

(71) Applicant: CANON MEDICAL SYSTEMS CORPORATION, Otawara-shi (JP)

(72) Inventors: Masaki Tanji, Nasushiobara (JP); Hajime Tanaka, Sakura (JP); Hiroaki Murakoshi, Tama (JP)

(73) Assignee: CANON MEDICAL SYSTEMS CORPORATION, Otawara-shi (JP)

( * ) Notice: Subject to any disclaimer, the term of this patent is extended or adjusted under 35 U.S.C. 154(b) by 0 days.

(21) Appl. No.: 16/275,686

(22) Filed: Feb. 14, 2019

(65) Prior Publication Data
US 2019/0250225 A1 Aug. 15, 2019

(30) Foreign Application Priority Data

Feb. 15, 2018 (JP) .................................. 2018-025045
Feb. 13, 2019 (JP) .................................. 2019-023209

(51) Int. Cl.
| | |
|---|---|
| *G01R 33/28* | (2006.01) |
| *G01R 27/26* | (2006.01) |
| *G01R 33/36* | (2006.01) |
| *H01P 5/18* | (2006.01) |

(52) U.S. Cl.
CPC ........... *G01R 33/288* (2013.01); *G01R 27/26* (2013.01); *G01R 33/36* (2013.01); *G01R 33/3614* (2013.01); *H01P 5/18* (2013.01); *G01R 33/3607* (2013.01)

(58) Field of Classification Search
CPC .. G01R 33/288; G01R 33/36; G01R 33/3614; G01R 33/3607; G01R 27/26; H01P 5/18
See application file for complete search history.

(56) References Cited

U.S. PATENT DOCUMENTS

| | | | |
|---|---|---|---|
| 9,864,021 B1 | 1/2018 | Habara et al. | |
| 2012/0026063 A1* | 2/2012 | Lee .................. | H03H 11/40 343/860 |
| 2014/0232407 A1 | 8/2014 | Nakamura et al. | |
| 2015/0293187 A1* | 10/2015 | Arai .................. | G01R 33/36 324/309 |
| 2017/0371011 A1 | 12/2017 | Nakamura et al. | |

FOREIGN PATENT DOCUMENTS

| | | |
|---|---|---|
| JP | 2014-079573 | 5/2014 |
| JP | 2017-109109 | 6/2017 |

* cited by examiner

*Primary Examiner* — Gregory H Curran
(74) *Attorney, Agent, or Firm* — Oblon, McClelland, Maier & Neustadt, L.L.P.

(57) ABSTRACT

According to one embodiment, an RF circuit includes a directional coupler, processing circuitry, and an adjuster. The directional coupler includes a first port for outputting at least a part of a traveling wave and a second port for outputting at least a part of a reflected wave. The processing circuitry is configured to calculate impedance of a load side that is viewed from the directional coupler, by using a voltage standing wave ratio based on respective outputs from the first port and the second port and a phase of the reflected wave based on an output from the second port. The adjuster is configured to adjust an output from at least one of the first port and the second port based on the impedance calculated by the processing circuitry.

13 Claims, 5 Drawing Sheets

RF CIRCUIT, MRI APPARATUS, AND METHOD OF MONITORING RF PULSE POWER

CROSS-REFERENCE TO RELATED APPLICATIONS

This application claims the benefit of priority of Japanese Patent Application No. 2018-025045, filed on Feb. 15, 2018, and Japanese Patent Application No. 2019-023209, filed on Feb. 13, 2019, the entire contents of each of which are incorporated herein by reference.

FIELD

Embodiments described herein relate generally to an RF (Radio Frequency) circuit, an MRI (Magnetic Resonance Imaging) apparatus, and a method of monitoring for RF pulse power.

BACKGROUND

With regard to use of an MRI apparatus, in order to suppress the influence of an RF pulse on an object such as temperature rise, it is required to suppress SAR (Specific Absorption Rate, i.e., RF absorption amount per unit mass) to be below or equal to the threshold value in accordance with the regulations of IEC (International Electrotechnical Commission).

In order to satisfy safety standards related to SAR, it is important to accurately monitor power of the RF pulse applied to an object. For instance, the power of the RF pulse is monitored by using a directional coupler for extracting a part of the RF pulse at its output point to a transmission coil. However, in an MRI apparatus, the distance between the object and the transmission coil is short, and thus the load impedance of the RF pulse varies depending on the imaging conditions such as the posture, position or size of the object. For this reason, impedance mismatch occurs at the output terminal of the RF pulse, and it is difficult to accurately monitor the power of the RF pulse.

DETAILED DESCRIPTION

Hereinbelow, a description will be given of respective embodiments of an RF circuit, an MRI apparatus, and a method of monitoring RF pulse power in detail by referring to the accompanying drawings.

In general, according to one embodiment, an RF circuit includes a directional coupler, processing circuitry, and an adjuster. The directional coupler includes a first port for outputting at least a part of a traveling wave and a second port for outputting at least a part of a reflected wave. The processing circuitry is configured to calculate impedance of a load side that is viewed from the directional coupler, by using a voltage standing wave ratio based on respective outputs from the first port and the second port and a phase of the reflected wave based on an output from the second port. The adjuster is configured to adjust an output from at least one of the first port and the second port based on the impedance calculated by the processing circuitry.

Figure 1:
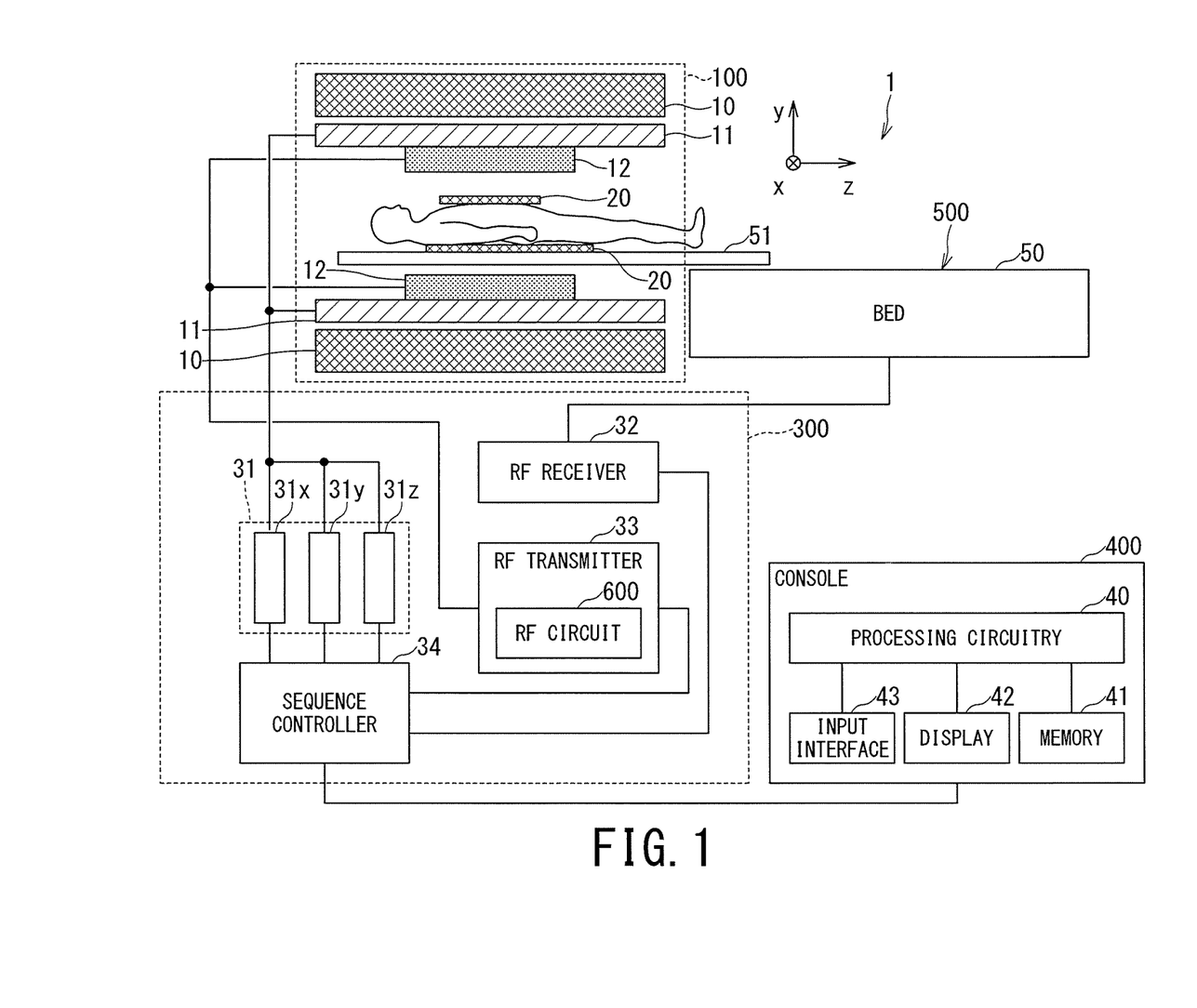
FIG. 1 is a block diagram illustrating a configuration of an MRI apparatus including an RF circuit according to one embodiment.

FIG. 1 is a block diagram illustrating a configuration of an MRI apparatus 1 including an RF circuit 600 according to one embodiment. The MRI apparatus 1 includes a main body (also referred to as a gantry) 100, a control cabinet 300 including the RF circuit 600, a console 400, a bed 500, and local RF coils 20. The main body 100, the control cabinet 300, and the bed 500 are generally installed in an examination room. The console 400 is generally installed in a control room adjacent to the examination room.

The main body 100 includes a static magnetic field magnet 10, a gradient coil 11, and a WB (whole body) coil 12, and these components are housed in a cylindrical housing. The bed 500 includes a bed body 50 and a table 51.

The control cabinet 300 includes three gradient coil power supplies 31 ($31x$ for an X-axis, $31y$ for a Y-axis, and $31z$ for a Z-axis), an RF receiver 32, an RF transmitter 33, and a sequence controller 34. The RF transmitter 33 includes the RF circuit 600.

The console 400 includes processing circuitry 40, a memory 41, a display 42, and an input interface 43. The console 400 functions as a host computer.

The static magnetic field magnet 10 of the main body 100 is substantially in the form of a cylinder, and generates a static magnetic field inside a bore into which an object, e.g., a patient is transported. The bore is a space inside the cylindrical structure of the main body 100. The static magnetic field magnet 10 includes a superconducting coil inside, and the superconducting coil is cooled down to an extremely low temperature by, e.g., liquid helium. The static magnetic field magnet 10 generates a static magnetic field by supplying the superconducting coil with an electric current provided from a non-illustrated static magnetic field power supply in an excitation mode. Afterward, the static magnetic field magnet 10 shifts to a permanent current mode, and the static magnetic field power supply is separated. Once it enters the permanent current mode, the static magnetic field magnet 10 continues to generate a static magnetic field for a long time, e.g., over one year. Note that the static magnetic field magnet 10 is not limited to a superconducting magnet but may be a permanent magnet.

The gradient coil 11 is also substantially in the form of a cylinder similarly to the static magnetic field magnet 10, and is fixed to the inside of the static magnetic field magnet 10. The gradient coil 11 forms gradient magnetic fields in the respective directions of the X-axis, the Y-axis, and the Z-axis by using electric currents supplied from the gradient coil power supplies $31x$, $31y$, and $31z$.

The bed body 50 of the bed 500 can move the table 51 in the vertical direction and in the horizontal direction. For instance, the bed body 50 moves the table 51 with an object loaded thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder to surround the object, and is fixed to the inside of the gradient coil 11. The WB coil 12 applies RF pulses transmitted from the RF circuit 600 of the RF transmitter 33 to the object. The WB coil 12 is an example of RF coils for applying an RF pulse to an object. The WB coil 12 receives magnetic resonance signals, i.e., MR signals emitted from the object due to excitation of hydrogen nuclei.

The MRI apparatus 1 may include the local RF coils 20 as shown in FIG. 1 in addition to the WB coil 12. Each of the local RF coils 20 is placed close to the body surface of the object. There are various types for the local RF coils 20. For instance, as the types of the local RF coils 20, as shown in FIG. 1, there are a body coil attached to the chest, abdomen, or legs of the object and a spine coil attached to the backside of the object. The local RF coils 20 may be of a type dedicated for receiving MR signals, another type dedicated for transmitting RF pulses, or still another type for performing both of transmitting RF pulses and receiving MR signals. The local RF coils are examples of an RF coil for applying an RF pulse to an object. The local RF coils 20 are configured to be attachable to and detachable from the table 51 via a cable, for instance.

The RF receiver 32 performs A/D (Analog to Digital) conversion on the channel signal from the WB coil 12 and/or the local RF coils 20, i.e., the MR signals, and outputs the converted MR signals to the sequence controller 34. The MR signals converted into digital signals are sometimes referred to as raw data.

The RF transmitter 33 includes an RF oscillator, a modulator, and the RF circuit 600, and generates an RF pulse based on an instruction from the sequence controller 34. The generated RF pulse is transmitted to the WB coil 12 and applied to the object. MR signals are generated from the object by the application of the RF pulse. The MR signals are received by the local RF coils 20 and/or the WB coil 12.

The RF circuit 600 amplifies an RF signal outputted from the modulator to generate an RF pulse, while adjusting the monitoring-target power of the RF pulse according to the degree of the impedance mismatch of the load. Details of the RF circuit 600 will be described below by referring to FIG. 3 to FIG. 5.

The MR signals received by the local RF coils 20, more specifically, the MR signals received by each of the coil elements in the RF coils 20, are inputted to the RF receiver 32 via cables provided on the table 51 and the bed body 50.

The sequence controller 34 performs a scan of the object by driving each of the gradient coil power supplies 31, the RF receiver 32, and the RF transmitter 33 and under the control of the console 400. When the sequence controller 34 receives raw data from the RF receiver 32 by performing a scan, the sequence controller 34 transmits the received raw data to the console 400.

The sequence controller 34 includes non-illustrated processing circuitry. This processing circuitry is configured of hardware such as a processor for executing predetermined programs, an FPGA (Field Programmable Gate Array), and an ASIC (Application Specific Integrated Circuit).

The console 400 includes a memory 41, a display 42, an input interface 43, and processing circuitry 40.

The memory 41 is a recording medium including a ROM (Read Only memory) and a RAM (Random Access Memory) in addition to an external memory device such as a HDD (Hard Disk Drive) and an optical disc device. The memory 41 stores various programs executed by the processor of the processing circuitry 40 as well as various types of data and information.

The display 42 is a display device such as a liquid crystal display panel, a plasma display panel, and an organic EL panel.

The input interface 43 includes various devices for an operator to input various types of information and data. The input interface 43 is configured of, e.g., a mouse, a keyboard, a trackball, and/or a touch panel.

The processing circuitry 40 is, e.g., a circuit equipped with a CPU (Central Processing Unit) and/or a special-purpose or general-purpose processor. The processor implements various functions by executing the various programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

For instance, the processing circuitry 40 implements a function of calculating SAR, based on the output of the adjuster of the RF circuit 600.

Next, the configuration and operation of the RF frequency circuit 600 will be described.

Figure 2:
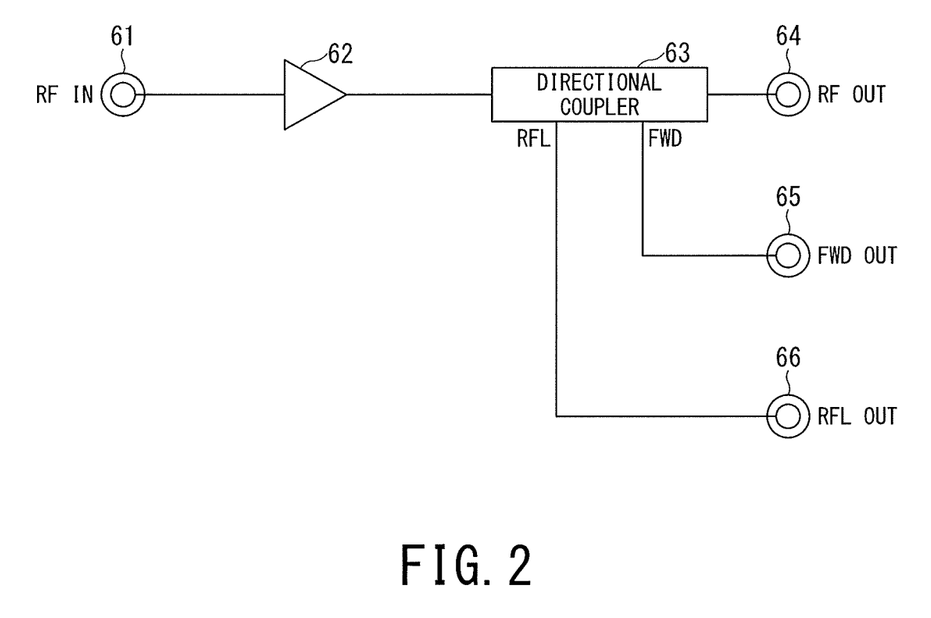
FIG. 2 is a block diagram illustrating a configuration of a conventional RF circuit.

FIG. 2 is a block diagram illustrating the configuration of a conventional RF circuit.

The power of the RF pulse applied to an object has been conventionally monitored by using the RF circuit shown in FIG. 2. In the conventional RF circuit, an RF pulse inputted from a modulator to an input terminal 61 is amplified by an amplifier 62. Further, in the conventional RF circuit, at least a part of the traveling-wave power of the amplified RF pulse (hereinafter, referred to as monitoring traveling-wave power FWD) and at least a part of the reflected-wave power (hereinafter, referred to as monitoring reflected-wave power RFL) are separated from the amplified RF pulse by a directional coupler 63. The monitoring traveling-wave power FWD and the monitoring reflected-wave power RFL are outputted from an output terminal 65 for monitoring the traveling-wave power and from an output terminal 66 for monitoring the reflected-wave power, respectively.

In the conventional technique, the power of the RF pulse outputted from the RF pulse output terminal 64 is monitored on the basis of the monitoring traveling-wave power FWD outputted from the output terminal 65 and the monitoring reflected-wave power RFL outputted from the output terminal 66.

However, the impedance of the load side that is viewed from the directional coupler 63, i.e., the impedance of the load side connected to the RF pulse output terminal 64 varies depending on, e.g., the posture, position, or size of the object and the type of each RF coil 20. On the other hand, the coupling degree of the directional coupler 63 is defined such that the impedance of the load side (hereinafter, referred to as load impedance) $R \pm jX$ becomes a predetermined fixed value such as $50\Omega \pm 0\Omega$, thus leading to impedance mismatch. When impedance mismatch due to imaging conditions such as the posture of the object occurs at the RF pulse output terminal 64, the coupling degree of the directional coupler 63 changes. Changing of the coupling degrees causes the accuracy of monitoring the RF pulse power to deteriorate.

Hence, in the conventional technique, the error of the monitored RF pulse power should be considered because the error due to impedance mismatch influences the calculation of SAR. For example, the upper limit of SAR may be set to be lower than the threshold value of SAR (e.g., the threshold value based on the regulations of IEC). There could be a case where the power of the RF pulse must be set small although the higher RF power could be supplied, and the imaging time is prolonged.

To address this issue, the RF circuit 600 according to the present embodiment is configured to correct at least one of the monitoring traveling-wave power FWD and the monitoring reflected-wave power RFL according to the degree of the impedance mismatch of the load.

Figure 3:
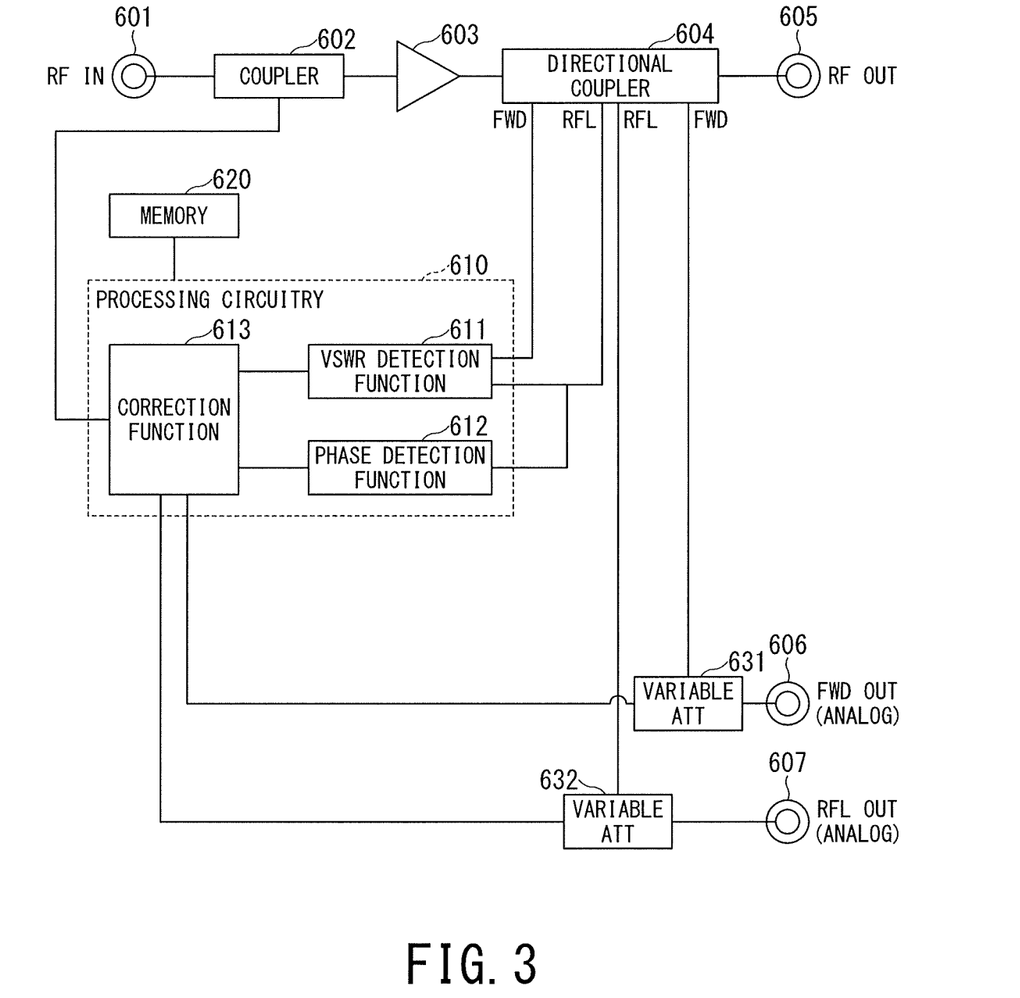
FIG. 3 is a block diagram illustrating a configuration of the RF circuit according to the present embodiment.

FIG. 3 is a block diagram illustrating a configuration of the RF circuit 600 according to the present embodiment.

Figure 4:
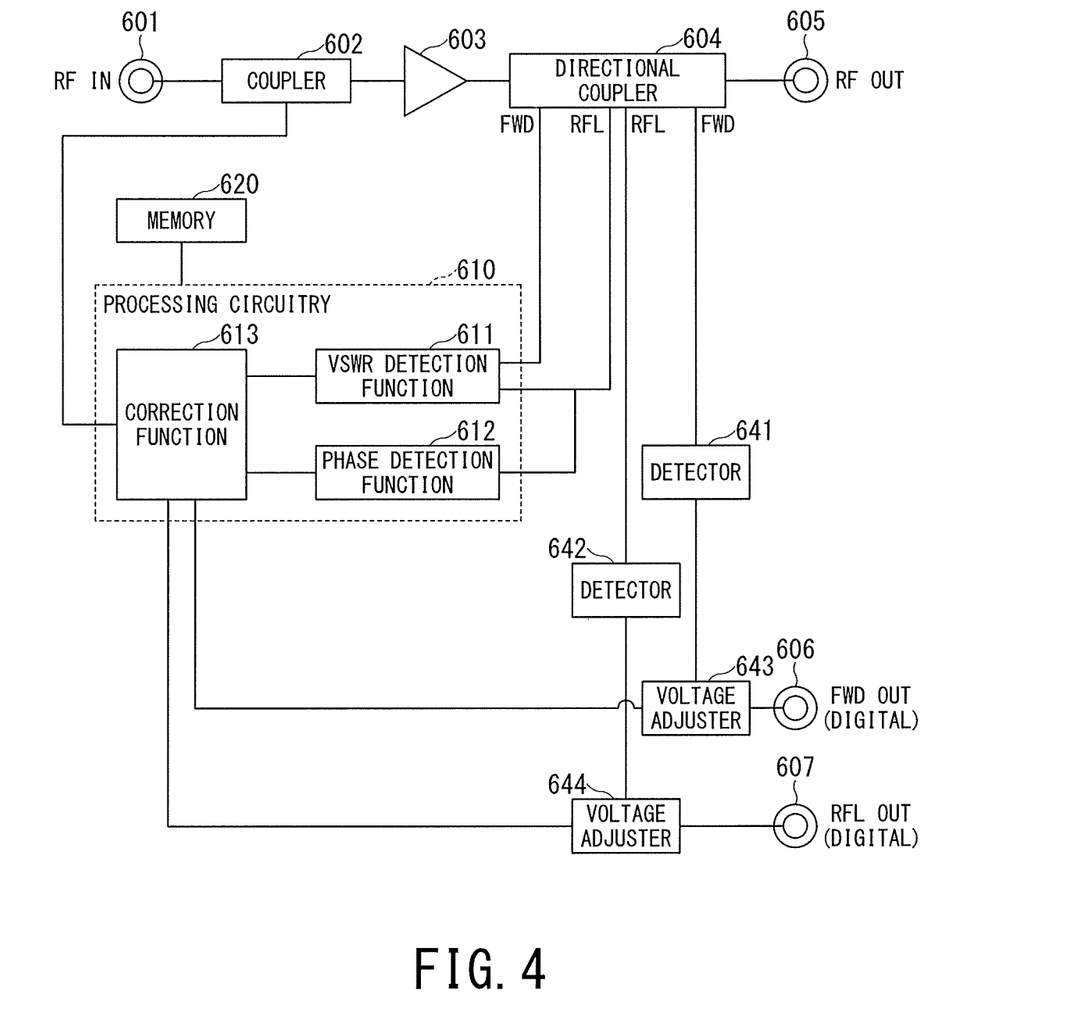
FIG. 4 is a block diagram illustrating another configuration of the RF circuit according to the present embodiment.

FIG. 4 is a block diagram illustrating another configuration of the RF circuit 600 according to the present embodiment.

Figure 5:
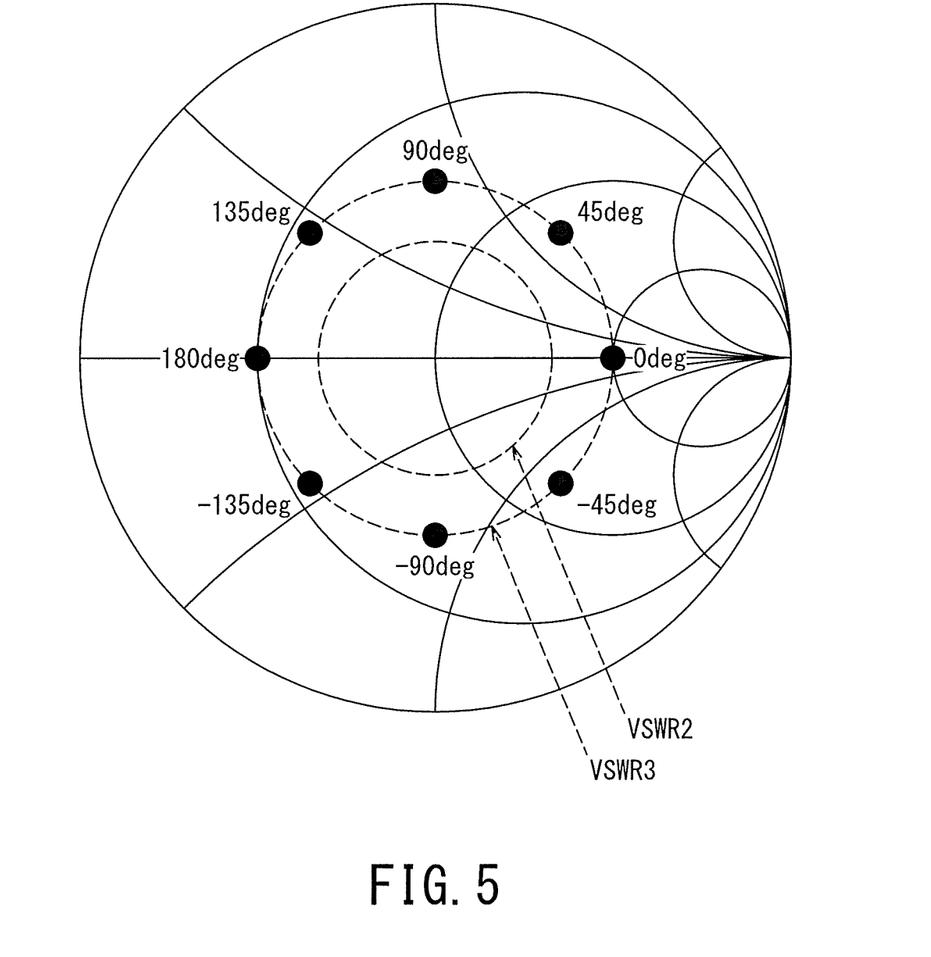
FIG. 5 is a schematic diagram illustrating a Smith chart.

FIG. 5 is a schematic diagram illustrating a Smith chart.

FIG. 3 illustrates one configuration of the RF circuit 600 in the case of outputting the corrected monitoring traveling-wave power FWD and the corrected monitoring reflected-wave power RFL in analog form.

FIG. 4 illustrates one configuration of the RF circuit 600 in the case of digitally outputting the corrected monitoring traveling-wave power FWD and the corrected monitoring reflected-wave power RFL.

As shown in FIG. 3, the RF circuit 600 according to the present embodiment includes an input terminal 601, a coupler 602 for input monitoring, an amplifier 603, a directional coupler 604, an RF pulse output terminal 605, an output terminal 606 for monitoring the traveling-wave power, an output terminal 607 for monitoring the reflected-wave power, processing circuitry 610, a memory 620, a variable attenuator (ATT) 631 for correcting the monitoring traveling-wave power FWD, and a variable ATT 632 for correcting the monitoring reflected-wave power RFL. Each of the variable ATTs 631 and 632 is an example of an adjuster.

The input timing of the RF pulse inputted from the modulator to the input terminal 61 is monitored by the processing circuitry 610 via the coupler 602. The RF pulse is amplified by the amplifier 603. The amplified RF pulse is inputted, as a traveling wave, to the directional coupler 604, is outputted from the RF pulse output terminal 605 via the directional coupler 604, and then is applied to the object via the WB coil 12. A part of the traveling wave is reflected due to the impedance mismatch of the load viewed from the directional coupler 604.

The directional coupler 604 includes a port for extracting and outputting at least a part of the traveling-wave power of the RF pulse amplified by the amplifier 603 (i.e., the monitoring traveling-wave power FWD) and another port for extracting and outputting at least a part of the reflected wave power (i.e., the monitoring reflected-wave power RFL). In the following, a description will be given for a case where the coupling degree of the directional coupler 604 is defined as a load impedance of 50Ω±0Ω. The monitoring traveling-wave power FWD and the monitoring reflected-wave power RFL may be extracted by only one directional coupler 604 as shown in FIG. 3 and FIG. 4 or may be separately extracted by using plural directional couplers.

The processing circuitry 610 includes a processor that executes processing of adjusting at least one of the monitoring traveling-wave power FWD and the monitoring reflected wave power RFL depending on the degree of the impedance mismatch of the load for accurately monitoring the power of the RF pulse applied to an object by reading and executing the programs stored in the memory 620. In the following, the monitoring traveling-wave power FWD and the monitoring reflected wave power RFL are collectively referred to as monitoring power, in order to shorten the description. The processing circuitry 610 is an example of first processing circuitry.

The memory 620 has a configuration including a processor-readable recording medium such as a hard disk, an optical disk, and a semiconductor memory element including e.g., a RAM and a flash memory. The memory 620 stores various types of information such as a table in which the load impedance and the adjustment degree of the monitoring power are associated with each other. These various types of information stored in the memory 620 may be updated via a network or via a portable storage medium such as an optical disk.

The processor of the processing circuitry 610 implements a VSWR (Voltage Standing Wave Ratio) detection function 611, a phase angle detection function 612, and a correction function 613. Each of these functions is stored in the memory 620 in the form of a program.

The VSWR detection function 611 detects the voltage standing wave ratio (VSWR) on the basis of the amplitude of the monitoring traveling-wave power FWD and the amplitude of the monitoring reflected-wave power RFL (FIG. 5).

The phase angle detection function 612 detects the phase angle of the load on the basis of the phase of the monitoring reflected-wave power RFL (FIG. 5).

The VSWR detection function 611 and the phase angle detection function 612 may determine timing for detecting the amplitude of the monitoring traveling-wave power FWD and the amplitude of the monitoring reflected-wave power RFL, by using information regarding an amplitude of the signal inputted to the coupler 602.

The correction function 613 calculates the load impedance on the basis of the detected VSWR value and the detected phase angle. The VSWR value and the phase angle reflect the state of the load. The correction function 613 may calculate the load impedance by using the detected VSWR value and the detected phase angle or by using a table in which the VSWR values, the phase angle values, and the load impedance values are associated with each other.

In addition, the correction function 613 corrects the attenuation degree (i.e., adjustment degree) of at least one of the variable ATTs 631 and 632 on the basis of the determined load impedance.

Specifically, the correction function 613 corrects the adjustment degree of at least one of the variable ATTs 631 and 632 according to the mismatch degree between the prescribed load impedance value 50Ω and the calculated load impedance value such that the monitoring power corresponding to the power of the RF pulse actually outputted from the RF pulse output terminal 605 is outputted from each of the output terminals 606 and 607.

At this time, the correction function 613 may calculate the adjustment degree of at least one of the variable ATTs 631 and 632 by using the calculated load impedance value or a table in which the load impedance and the adjustment degree are associated with each other. Additionally, the correction function 613 may calculate the adjustment degree on the basis of an output of a comparator that outputs the difference between the prescribed load impedance value and the calculated load impedance value.

Further, the monitoring power may be digitally outputted. In this case, as shown in FIG. 4, the RF circuit 600 may include a wave detector 641 and a voltage adjuster 643 instead of the variable ATT 631 and further include a detector 642 and a voltage adjuster 644 instead of the variable ATT 632. Each of the voltage adjusters 643 and 644 is an example of the adjuster.

In this case, the monitoring traveling-wave power FWD and the monitoring reflected-wave power RFL outputted from the directional coupler 604 are respectively detected by wave detectors 641 and 642, and are converted into DC (Direct Current) signals. The correction function 613 corrects the adjustment degree of at least one of the voltage adjusters 643 and 644 on the basis of the calculated load impedance. By digitally outputting the monitoring power subjected to the correction, the subsequent AD conversion processing can be omitted.

According to the RF circuit 600 of the present embodiment, it is possible to measure the load impedance that can change depending on imaging conditions such as a posture, size or position of an object. In addition, the monitoring traveling-wave power FWD and the monitoring reflected-wave power RFL outputted from the directional coupler 604 can be corrected by using the variable attenuators 631 and 632 depending on the measured value of the load impedance. Thus, even when the load impedance deviates from the prescribed value 50Ω, the RF pulse power can be accurately monitored.

Hence, it is possible to accurately ascertain the power of the RF pulse applied to the object, and the RF power can be effectively outputted from the RF amplifier.

In addition, it is possible to more accurately monitor the power of the RF pulse applied to the object as compared with the case where impedance mismatch of the load is not considered. Accordingly, the processing circuitry 40 of the console 400 can accurately calculate SAR on the basis of the output of the adjuster (e.g., the variable ATTs 631 and 632 shown in FIG. 3 for an analog output, the voltage adjusters 643 and 644 shown in FIG. 4 for a digital output). Hence, it is possible to apply an RF pulse of large power to the object in a short time, and consequently, imaging time can be considerably shortened.

According to at least one embodiment described above, it is possible to accurately monitor the power of each RF pulse applied to an object.

The processing circuitry in the above-described embodiments is an example of the processing circuitry described in the claims. In addition, the term "processor" used in the explanation in the above-described embodiments, for instance, refer to circuitry such as dedicated or general purpose CPUs (Central Processing Units), dedicated or general-purpose GPUs (Graphics Processing Units), or ASICs (Application Specific Integrated Circuits), programmable logic devices including SPLDs (Simple Programmable Logic Devices), CPLDs (Complex Programmable Logic Devices), and FPGAs (Field Programmable Gate Arrays), and the like. The processor implements various types of functions by reading out and executing programs stored in the memory circuitry.

Further, functions implemented by the processing circuitry 40 and the processing circuitry 610 may be implemented by the single processor such as a processor of the processing circuitry 40 of the console 400.

Although in the above-described embodiments an example is shown in which the processing circuitry 610 configured of a single processor implements functions 611-613, the processing circuitry may be configured by combining plural processors independent of each other so that each processor implements each function of the processing circuitry by executing corresponding program. When a plurality of processors are provided for the processing circuitry, the memory medium for storing programs may be individually provided for each processor, or one memory circuitry may collectively store programs corresponding to all the functions of the processors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An RF circuit comprising:
a directional coupler including a first port for outputting at least a part of a traveling wave and a second port for outputting at least a part of a reflected wave;
processing circuitry configured to calculate impedance of a load side that is viewed from the directional coupler; by using a voltage standing wave ratio based on respective outputs from the first port and the second port and a phase of the reflected wave based on an output from the second port; and
an adjuster configured to adjust an output from at least one of the first port and the second port based on the impedance calculated by the processing circuitry.

2. The RF circuit according to claim 1,
wherein the processing circuitry is configured to adjust an adjustment degree of the adjuster based on a table in which the impedance calculated by the processing circuitry and the adjustment degree of the adjuster are associated.

3. The RF circuit according to claim 1,
wherein the processing circuitry is configured to adjust an adjustment degree of the adjuster based on an output from a comparator that outputs a difference between the impedance calculated by the processing circuitry and a prescribed value of the impedance of the load side.

4. The RF circuit according to claim 1, further comprising two power-monitoring output ports,
wherein one of the two power-monitoring output ports is configured to outwardly output power of the traveling wave outputted from the first port while another of the two power-monitoring output ports is configured to outwardly output power of the reflected wave outputted from the second port, wherein at least one of the powers is being subjected to be adjusted by the adjuster.

5. The RF circuit according to claim 4,
wherein the adjuster includes an attenuator, is configured to adjust attenuation degree of an output from at least one of the first port and the second port based on the impedance calculated by the processing circuitry, and is further configured to output the output subjected to adjustment of the attenuation degree in analogue form; and
the two power-monitoring output ports are configured to outwardly output, in analogue form, power of the traveling wave and power of the reflected wave, at least one of the powers being subjected to be adjusted by the adjuster.

6. The RF circuit according to claim 4,
wherein the adjuster includes a voltage adjuster, is configured to adjust an output voltage from at least one of the first port and the second port based on the impedance calculated by the processing circuitry, and is further configured to digitally output the output voltage subjected to adjustment; and
the two power-monitoring output ports are configured to outwardly and digitally output power of the traveling wave and power of the reflected wave, at least one of the powers being subjected to be adjusted by the adjuster.

7. The RF circuit according to claim 1, further comprising an RF amplifier configured to amplify and output an RF signal, and input the amplified RF signal to the directional coupler as the traveling wave.

8. An MRI apparatus comprising:
an RF coil configured to apply an RF pulse to an object based on an RF signal amplified by an amplifier;
a directional coupler configured to be disposed between the amplifier and the RF coil, output from a first port at least a part of a traveling wave inputted from a side of the amplifier, and output at least a part of a reflected wave from a second port;
first processing circuitry configured to calculate impedance of a load side that is viewed from the directional coupler, by using a voltage standing wave ratio based on respective outputs from the first port and the second port and a phase of the reflected wave based on an output from the second port;
an adjuster configured to adjust an output from at least one of the first port and the second port based on the impedance calculated by the first processing circuitry; and
second processing circuitry configured to calculate SAR (Specific Absorption Rate) based on an output from the adjuster.

9. The MRI apparatus according to claim 8,
wherein the first processing circuitry is configured to adjust an adjustment degree of the adjuster based on a table in which the impedance calculated by processing circuitry and the adjustment degree of the adjuster are associated.

10. The MRI apparatus according to claim 8,
wherein the first processing circuitry is configured to adjust an adjustment degree of the adjuster based on an output from a comparator that outputs a difference between the impedance calculated by the processing circuitry and a prescribed value of the impedance of the load side.

11. The MRI apparatus according to claim 8, further comprising two power-monitoring output ports,
wherein one of the two power-monitoring output ports is configured to outwardly output power of the traveling wave outputted from the first port while another of the two power-monitoring output ports is configured to outwardly output power of the reflected wave outputted from the second port, wherein at least one of the powers is subjected to be adjusted by the adjuster.

12. A method of monitoring RF pulse power comprising:
calculating impedance of a load side that is viewed from a directional coupler, which includes a first port for outputting at least a part of a travelling wave and a second port for outputting at least a part of a reflected wave, by using a voltage standing wave ratio based on respective outputs from the first port and the second port and a phase of the reflected wave based on an output from the second port; and
adjusting an output from at least one of the first port and the second port based on the calculated impedance.

13. The method according to claim 12, further comprising calculating SAR based on the respective outputs from the first port and the second port, wherein at least one of the respective outputs from the first port and the second port being subjected to be adjusted.

* * * * *